United States Patent [19]

Hwang et al.

[11] Patent Number: 4,847,210

[45] Date of Patent: Jul. 11, 1989

[54] INTEGRATED PIN PHOTO-DETECTOR METHOD

[75] Inventors: Bor-Yuan Hwang, Chandler; Carroll M. Casteel, Mesa; Sal T. Mastroianni, Tempe, all of Ariz.

[73] Assignee: Motorola Inc., Schaumburg, Ill.

[21] Appl. No.: 228,646

[22] Filed: Aug. 5, 1988

[51] Int. Cl.⁴ .............................................. B01L 27/14
[52] U.S. Cl. .......................................... 437/3; 437/2; 357/30; 357/55; 357/58
[58] Field of Search .................. 357/55, 30 P, 58; 437/2, 3, 77, 78, 90

[56] References Cited

U.S. PATENT DOCUMENTS

| | | | |
|---|---|---|---|
| 3,619,665 | 10/1969 | Kosonocky | 307/279 |
| 3,946,423 | 3/1976 | Augustine | 357/30 |
| 4,009,058 | 2/1977 | Mills | 357/58 |
| 4,101,350 | 7/1978 | Possley et al. | 148/175 |
| 4,183,034 | 1/1980 | Burke et al. | 357/30 |
| 4,243,997 | 1/1981 | Natori et al. | 357/58 |
| 4,378,460 | 3/1983 | Williams | 357/30 |
| 4,395,433 | 7/1983 | Nagakubo et al. | 427/35 |
| 4,400,411 | 8/1983 | Yuan et al. | 427/86 |
| 4,543,443 | 7/1985 | Moeller et al. | 357/71 |
| 4,680,085 | 7/1987 | Vijan et al. | 437/3 |
| 4,695,871 | 9/1987 | Tsunoda | 357/74 |
| 4,718,063 | 1/1988 | Reedy et al. | 370/112 |

OTHER PUBLICATIONS

Borland et al., "Advanced Dielectric Isolation Through Selective Epitaxial Growth Techniques" Solid State Technology, vol. 28(8), Aug., 1985, pp. 141-148.

*Primary Examiner*—Brian E. Hearn
*Assistant Examiner*—Tuan Nguyen
*Attorney, Agent, or Firm*—Robert M. Handy; Joe E. Barbee

[57] ABSTRACT

An improved means and method for forming an optical sensor within an integrated circuit structure is described. An epi-coated semiconductor wafer is masked and a cavity etched through the epi-layer to the underlying substrate. A dielectric sidewall is formed on the cavity sidewall and a substantially intrinsic semiconductor region, preferably grown by selective epitaxy, to refill the cavity. The upper surface of the intrinsic region is then heavily doped and contacted by a low resistance polysilicon layer which is substantially transparent to incoming light. The method forms a high sensitivity PIN photo-sensor having a thick space-charge region for efficient capture of the hole-electron pairs produced by the incoming light. The fabrication techniques are compatible with the processing requirements for other integrated circuit devices formed on the same chip and to which the PIN device is coupled without wire bonds, tabs, bumps or the like.

19 Claims, 1 Drawing Sheet

INTEGRATED PIN PHOTO-DETECTOR METHOD

BACKGROUND OF THE INVENTION

This invention relates, in general, to semiconductor devices and, more particularly, to a means and method for providing an integrated photosensor for semiconductor integrated circuits in a fashion compatible with the methods and structures used for such integrated circuits.

Integrated circuits containing thousands to millions of transistors and other elements are commonplace today. These integrated circuits operate at such high speeds that the propagation time of signals from one part to another of the integrated circuit chip or from one integrated circuit chip to another are of concern. For these and other reasons there is great interest in providing optical devices within integrated circuits so that signals may be coupled optically rather than electrically.

It is known in the prior art to provide optical coupling to integrated circuits by a hybrid approach, that is, using separately constructed optical sensors which are mounted on or near a semiconductor die containing the circuitry intended to use the optically received signal and then connecting the sensor die and the integrated circuit die by wire bonding, tab bonding, solder bumps, or the like. This approach has the advantage of allowing the optical device and the integrated circuit to be individually optimized so far as their manufacturing and electrical characteristics are concerned. However, when very small optical devices are needed for use in connection with highly complex and dense modern day integrated circuits, this hybrid approach is no longer satisfactory. Thus, there is an ongoing need for means and methods for constructing high performance optical sensors on the same substrate and at the same time as the semiconductor integrated circuit to which it is electrically coupled and of small dimension.

Accordingly, it is an object of the present invention to provide a means and method for forming a photodetector as part of an integrated circuit.

It is a further object of the present invention to provide a means and method for forming a photodetector as part of an integrated circuit using compatible fabrication methods and structure.

It is an additional object of the present invention to provide a means and method for forming a photodetector as part of an integrated circuit using compatible fabrication methods and structure and which has high sensitivity and performance at the low voltages commonly used for integrated circuits, especially with high speed and high density bipolar integrated circuits.

As used herein the word "intrinsic" in connection with semiconductor materials is intended to refer to semiconductor materials of either conductivity type having a resistivity greater than about one hundred ohm-cm.

SUMMARY OF THE INVENTION

The foregoing and other objects and advantages are provided by the method and structure of the present invention wherein there is provided a semiconductor wafer having a major surface in which a cavity is formed. The cavity has a sidewall extending into the wafer and a bottom of a first conductivity type spaced from the wafer surface. A dielectric liner is provided on the cavity sidewall. A substantially intrinsic semiconductor material is formed in the cavity in contact with the bottom and its surface is doped with a dopant of a second conductivity type opposite the first type. An ohmic contact is formed to the doped region.

Where the substrate has a thin surface epi-layer, it is desirable that the cavity extend through the surface epi-layer to the substrate.

It is desirable to at least partially fill the cavity with substantially single crystal semiconductor material nucleated from the cavity bottom. It is further desirable prior to the refilling step to provide a substrate surface laterally outside the cavity on which the semiconductor material formed in the cavity does not nucleate.

An integrated photodetector constructed according to the foregoing process comprises a semiconductor wafer with an optional surface epi-layer, a cavity extending through the surface epi-layer to the substrate, a dielectric liner on the cavity sidewall, a substantially intrinsic semiconductor material nucleated from the cavity bottom and substantially filling the cavity, and a doped region of opposite type to the substrate formed in the outer surface of the intrinsic material. An ohmic contact is provided to the doped region which admits light into the underlying intrinsic material.

A more complete understanding of the present invention and advantages thereof will be attained from the following description and the accompanying drawings.

DETAILED DESCRIPTION OF THE DRAWINGS

The description that follows refers to silicon as an exemplary semiconductor material suitable for the present invention and illustrates the device and process in terms of particular conductivity types. However, this is intended merely for purposes of explanation and not limitation. Those of skill in the art who have studied the invention described herein will understand that it applies to other semiconductor materials and other choices of conductivity types and conductivities wherein a PN junction or other internal energy barrier able to provide for charge separation is formed.

Figure 1:
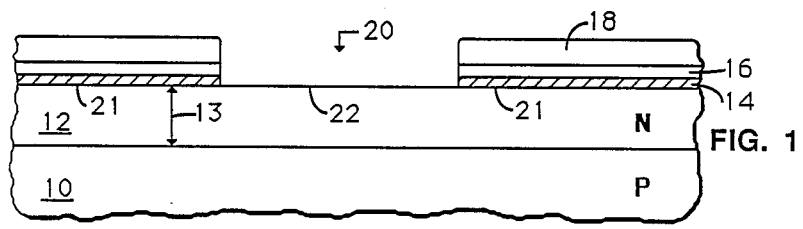
FIGS. 1-6 show simplified schematic cross-sectional views of a portion of a semiconductor wafer during different stages of fabrication according to the present invention.

Referring now to FIG. 1, semiconductor wafer 10 having surface epi-layer 12 is provided with protective layers 14, 16, 18. In the example shown, substrate 10 is P-type and epi-layer 12 is N-type silicon, which is a frequently used arrangement in integrated circuits, particularly bipolar integrated circuits. However, other materials and conductivity types may also be used. In typical applications, epi-layer 12 has thickness 13 in the range of about 0.6 to 2.0 micrometers with about 0.8 to 1.2 micrometers being convenient and about 1.0 micrometers being typical. Epi-layer 12 is not essential to the present invention but is of special concern since it is frequently used in integrated circuits. The present method and structure for forming an integrated photosensor works whether epi-layer 12 is present or not.

Layer 14 is conveniently of silicon dioxide formed, for example, by thermal oxidation of epi-layer 12. Layer 14 is desirable but not essential and is intended to function primarily as a buffer layer between epi-layer 12 and layers 16, 18. Layer 14 is conveniently about 0.05 to 0.1 micrometers thick with about 0.07 micrometers being preferred. Layer 14 may be prepared by any convenient technique, but thermal oxidation is preferred for silicon substrates. Thicker or thinner layers may also be used. Method for forming such layers are well known in the art.

Layer 16 is conveniently of silicon nitride, but other masking materials resistant to etching of epi-layer 12 and substrate 10 may also be used. Layer 16 is conveniently about 0.1 to 0.2 micrometers thick with about 0.15 micrometers being typical, but thicker or thinner layers may also be used. Methods for forming silicon nitride layers are well known in the art.

Layer 18 functions as a mask for delineating opening 20 through underlying layers 14, 16 and etching epi-layer 12 and substrate 10. Layer 18 may be of any convenient masking material. Photoresist and electron beam resist are typical materials well known in the art. Hard masking materials such as oxides, nitride, glasses or combinations thereof may also be used. Means and methods for forming mask layer 18 and delineating opening 20 are well known in the art.

The shape and lateral dimension of the photosensor is determined by the shape and lateral dimensions of opening 20, less the thickness of sidewall spacers 36 (see FIG. 6) to be subsequently described. Where the sensors are intended for use with single mode optical fibers, lateral dimensions of about ten micrometers are typical, and when for use with multi-mode optical fibers, lateral dimensions of about one hundred micrometers are typical. Larger sensors may be used but consume increased die area which is not desirable in dense circuits. Smaller sensors may be used provided the optical input can be adequately focused within the sensor area so that there is negligible optical signal loss laterally outside the sensor.

While multiple layers 14, 16, 18 are desirable, they are not essential. A single masking layer, either graded or homogeneous, that is able to protect surface portion 21 of semiconductor 10, 12 against etching and other process steps may also be used. Methods for forming such layers are well known. Glasses, silicon oxide, silicon nitride, or silicon oxy-nitride are non-limiting examples of suitable single layer masking materials. As will be subsequently explained, it is also desirable that the masking layer be non-nucleating during selective epitaxial deposition of the semiconductor material which forms the photosensor region.

Figure 2:
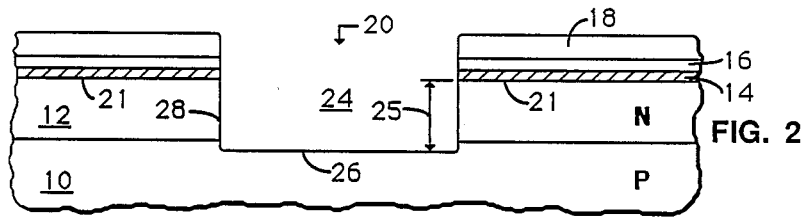
Figure 3:
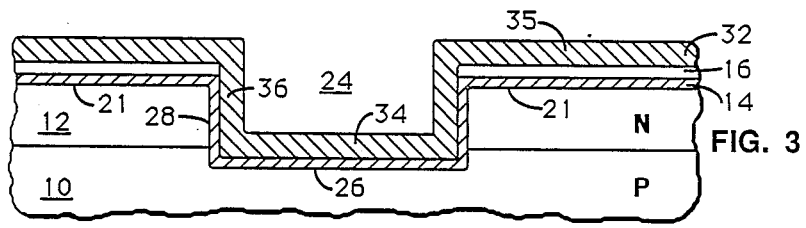

Referring now to FIG. 2, cavity 24 of depth 25 is etched in surface portion 22 of semiconductor 10, 12 under opening 20. Anisotropic etching is preferred. Depth 25 desirably exceeds thickness 13 so that cavity 24 extends through epi-layer 12. This is because in most high performance bipolar integrated circuits, thickness 13 of epi-layer 12 is smaller than the distance needed for efficient absorption of light. Hence, cavity 24 in which the integrated optical sensor is to be formed should in most cases have depth 25 greater than thickness 13. Depth 25 is conveniently in the range of about 3 to 20 micrometers with 7 to 13 micrometers being useful and about 10 micrometers being typical. Larger depths may also be used. Mask 18 may be removed after etching cavity 24.

Layer 14 is reconstituted on bottom 26 and sidewall 28 of cavity 24, for example by thermal oxidation, although other techniques may also be used. This step is desirable but not essential.

Dielectric layer 32 of, for example silicon dioxide, is deposited conformally over the wafer so as to form on sidewall 28 of cavity 24. Layer 32 has thickness conveniently of about 0.1 to 0.5 micrometers with about 0.3 micrometers being typical. CVD and LPCVD are suitable deposition techniques well known in the art, but other techniques may also be used. Thicker or thinner layers may also be used, provided that sufficient thickness remains on sidewall 28 to provide for lateral dielectric isolation between the sensor formed in cavity 24 and epi-layer 12.

Figure 4:
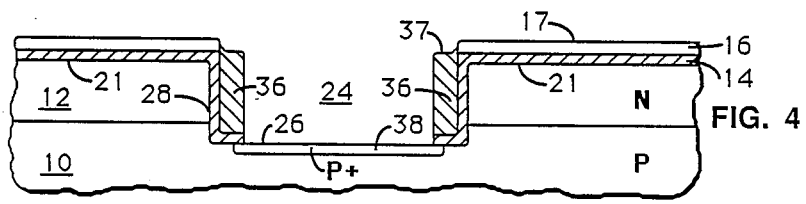

Layer 32 is then etched using anisotropic etching techniques well known in the art to remove portions 34 and 35 of layer 32 while leaving portion 36 on sidewall 28 (see FIG. 4).

Figure 5:
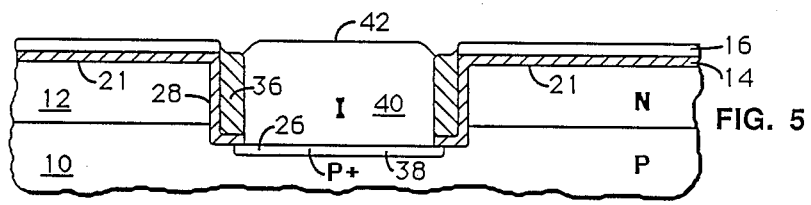

Referring now to FIGS. 4-5, bottom 26 of cavity 24 is desirably doped in region 38 to enhance its conductivity. In this example it is doped P+ so as to provide a low resistance contact to P-type substrate 10, however this is not essential. Ion implantation is a convenient method but other techniques may also be used. No masking step is required since layers 14, 16 continue to protect surface 21 while bottom 26 is exposed. If desired a thin screen oxide may be provided on bottom 26 before the implant to reduce implant damage, but this is not essential. If used, it should be removed before proceeding to the next step. Also, before filling cavity 24 with semiconductor, it is desirable to lightly etch bottom 26 of cavity 24 to remove any structural damage which may have been caused by earlier process steps. Wet etching is preferred.

Intrinsic semiconductor region 40 is formed in cavity 24 on (optional) doped region 38 (see FIG. 5). While polycrystalline material may be used for semiconductor region 40, single crystal material grown epitaxially on bottom 26 gives better results. Region 40 has upper surface 42. It is important that the semiconductor forming region 40 have high resistivity, that is, greater than about one hundred ohm-cm, preferably about one thousand ohm-cm or larger. This is because, in most integrated circuits, particularly modern integrated circuits of high density and complexity, power supply and logic voltages are only a few volts, typically five volts or less. Further, the present trend is toward even lower voltages. The lower the voltage, the higher the resistivity material that is required in order to have a space charge region of adequate width. If the space charge region is too narrow, most of the light will be absorbed outside the space charge region and sensitivity will be poor. In silicon and with light of about 830 nanometers wavelength, the optical absorption depth is about 10 micrometers. With a five volt supply, the intrinsic region should have a resistivity of about 100 ohm-cm in order to provide a space charge region of approximately comparable thickness. Those of skill in the art will understand based on the description herein how to select the resistivity and thickness of the intrinsic material in region 40 so as to provide a space charge region of adequate thickness.

It is desirable that region 40 be formed by selective epitaxial deposition, that is, under conditions such that semiconductor material 40 nucleates on exposed cavity bottom 26 in substrate 10 and not on the surface of the dielectric on other layers above surface portion 21 laterally outside cavity 24. Means for selective epitaxial growth are well known in the art and are described, for example, in U.S. Pat. Nos. 4,400,411, 4,395,433 and 4,101,350 and J. O. Borland et al. "Advanced Dielectric Isolation Through Selective Epitaxial Growth Techniques", Solid State Technology, Vol. 28 (8) (1985) pages 141-148. Silicon oxide, silicon nitride and mixtures thereof are examples of materials which can be arranged to be non-nucleating during epitaxial silicon growth. Alternatively, a conformal epitaxial layer of semiconductor material may be formed everywhere, filling cavity 24 and extending above the layers on surface 21, and then etched or lapped back to leave portion 40 in cavity 24.

Figure 6:
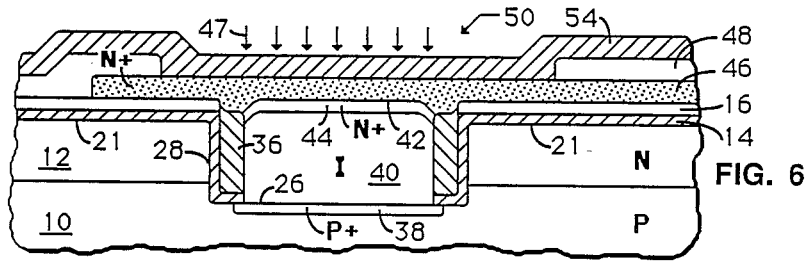

Referring now to FIGS. 5-6, upper surface 42 of intrinsic semiconductor region 40 is desirably doped to provide, in this example, shallow N+ region 44 extending to surface 42. Ion implantation is a suitable doping method, but other methods well known in the art may also be used. It is desirable that region 44 be relatively shallow, that is, less than about ten percent of the thickness of intrinsic region 40, preferably less than about five percent and conveniently about one to two percent of the thickness, so as to allow adequate room for the junction space charge region to expand into the remaining intrinsic material. The structure in cavity 24 now provides PIN photo-sensor 38, 40, 44 having a space charge region comparable in thickness to the light absorption depth. This provides high sensitivity and is very desirable for use in connection with modern integrated circuits.

Conductive layer 46 of, for example, polycrystalline semiconductor (e.g. polysilicon or other conductor), is formed on surface 42 to contact doped region 44. It is desirable that layer 46 be highly doped, e.g., N+, and comparatively thin so that it provides a low resistance electrical contact to PIN sensor 38, 40, 44 that is still substantially transparent to impinging light 47. Convenient thicknesses for layer 46 are about 0.15 to 0.4 micrometers with about 0.3 micrometers being typical. Convenient sheet resistance are about 10 to 200 ohms/square with about 100 ohms/square being typical. Methods for forming such layers are well known in the art.

Alternatively, layer 46 may be deposited before doped region 44 is formed and doped region 44 formed by out-diffusion of dopant from layer 46. This procedure has the advantage that a separate doping step for forming region 44 is not required. Layer 46 may be deposited doped or deposited without significant doping and subsequently doped by ion implantation or other well known methods.

Layer 46 is used, for example, for interconnecting PIN sensor 38, 40, 44 to an input terminal of another device on the same substrate, e.g. the gate of a FET or base of a bipolar transistor. Such devices and the use of polysilicon contact and interconnect layers are described for example, in U.S. patent application Ser. No. 07/009,322 to Peter J. Zdebel et al., entitled "Integrated Circuit Structures Having Polycrystalline Electrode Contacts and Process", which is incorporated herein by reference.

Light 47 falling on PIN sensor 38, 40, 44 causes the sensor to become conductive and/or generate a current, either of which can be coupled using means well known in the art to the input of a bipolar or field effect transistor or other amplifying device to provide the desired output signal to the remaining integrated circuitry on the same semiconductor die so that the light input, at least in part, controls the electrical output.

Further conductor 48 having light transparent opening 50 may be applied over conductor 46 to reduce its series resistance (see FIG. 6). Doped semiconductors, intermetallics and metals are suitable. Opening 50 should be of such dimensions so as to not obstruct passage of light 47 into PIN sensor 38, 40, 44. Passivation layer 54 of, for example, glass, silicon dioxide, silicon nitride or mixtures thereof or organic insulator may be applied on layers 46, 48 to provide improved surface protection and stabilization. Layer 54 must be transparent to light 47. Methods for applying such conductors and dielectrics are well known in the art.

One of the features of the present invention is that the thickness of intrinsic region 40 may be separately adjusted independent of the thickness of epi-layer 12 so as to obtain the optimal photo-electric response from sensor 38, 40, 44. For high sensitivity it is desirable to have the space charge region produced by the applied voltage substantially overlap the region in which light is absorbed. The electric field in the space charge region separates the electron-hole pairs created by the absorbed photons. If the space charge region is thin, then only a small fraction of the light is absorbed therein and most of the electron-hole pairs will be created elsewhere and sensitivity will be poor. This is what happens if the photosensor is constructed within the epi-layer of a high performance integrated circuit where the epi-layer is too thin for efficient light absorption therein. Hence, the ability provided by the present process to tailor the thickness of the intrinsic region independently of the constraints on the other device regions making up the integrated circuit is of great value.

The various layers used for the construction of the described photosensor are common to present day integrated circuit fabrication. The selective epitaxy step for cavity refill may be incorporated in the normal bipolar or MOS process flow without disruption since it may be carried out early in the fabrication cycle for such devices and has no substantial deleterious effect thereon. Steps necessary to provide doped regions 38 and 44, and highly doped layer 46, as well as layers 48 and 54 are routine in integrated circuit fabrication today. Layer 46 either alone or in combination with layer 48 permits integrated sensor 38, 40, 44 to be directly coupled to other devices on the same die using well known planar fabrication techniques and without need for wire-bonds, tabs, solder bumps or the like.

Having thus described the invention, it will be apparent that the present invention provides an improved means and method for forming a photosensor as part of and integrated circuit and which uses fabrication techniques and layers which are compatible with those used for fabricating integrated circuits on the same wafer and die, and which may be coupled thereto without external wires or the like.

While the present invention has been described in terms of certain exemplary materials and conductivity types, those of skill in the art who have studied this invention will understand that other combinations of materials and types may also be used and that the described optical sensor and method may be combined with many other device types and fabrication steps to produce a wide variety of integrated device structures and circuits. It is therefore intended to include such variations and combinations in the claims that follows.

We claim:

1. A process for forming integrated PIN diode;
   providing a semiconductor wafer having a principal surface;

forming a cavity penetrating into the semiconductor wafer from the surface, wherein the cavity has a bottom spaced from the surface and a sidewall extending therebetween, and wherein the bottom has a first conductivity type;

providing a dielectric liner on the cavity sidewall;

forming a substantially intrinsic semiconductor region in contact with the bottom of the cavity, wherein the intrinsic semiconductor region has a surface spaced from the bottom; and forming a doped region of a second conductivity type opposite the first conductivity type in the surface of the semiconductor region.

2. The process of claim 1 wherein the step of forming the doped region comprises forming the doped region with a thickness small compared to the substantially intrinsic region.

3. The process of claim 1 wherein the step of providing a semiconductor wafer comprises providing a semiconductor wafer having therein an epilayer of a conductivity type opposite that of the bottom of the cavity, wherein the epilayer extends from the surface to a depth shallower than the bottom of the cavity.

4. The process of claim 1 wherein the step of providing a dielectric liner on the cavity sidewall comprises conformally covering the bottom and sidewall of the cavity with a dielectric and then anisotropically etching the dielectric to remove the dielectric from the bottom of the cavity but not from the sidewall.

5. The process of claim 4 further comprising prior to conformally covering the bottom and sidewall of the cavity with a dielectric, forming an oxide underlayer on the cavity bottom and sidewalls by thermal oxidation.

6. The process of claim 4 further comprising prior to the step of depositing the conformal dielectric, forming a layer resistant to deposition of semiconductor material on a portion of the surface laterally outside the cavity.

7. The process of claim 1 further comprising prior to the step of forming the substantially intrinsic semiconductor region in the cavity, covering a portion of the surface laterally outside the cavity with a material which is resistant to deposition of the substantially intrinsic semiconductor region.

8. The process of claim 7 wherein the step of forming the substantially intrinsic semiconductor region comprises forming it by selective epitaxial deposition on the bottom of the cavity and not on the deposition resistant material.

9. The process of claim 1 wherein the step of forming the substantially intrinsic semiconductor region comprises growing it selectively on the bottom of the cavity and, substantially, not on a portion of the surface laterally outside the cavity.

10. The process of claim 1 further comprising providing a conductor contacting only a portion of the doped region, leaving another portion of the doped region free of the conductor.

11. The process of claim 10 further comprising providing an optically transparent dielectric coating overlying a further portion of the doped region.

12. The process of claim 1 further comprising providing an optically transparent dielectric coating overlying a portion of the doped region.

13. The process of claim 1 further comprising forming a transistor on the same substrate and electrically coupling the doped region to the transistor.

14. The process of claim 1 further comprising providing a gate of a transistor elsewhere on the substrate and electrically coupling the doped region to a gate.

15. A process for forming an integrated diode having a PIN structure, comprising:

providing a single crystal semiconductor wafer having a major surface;

forming a cavity having a sidewall extending into the wafer and a bottom spaced from the surface a predetermined distance, wherein the bottom has a first conductivity type;

providing a dielectric liner on the sidewall;

at least partly filling the cavity with a substantially intrinsic semiconductor material having an outer surface spaced from the cavity bottom, and then in either order;

doping at least part of the outer surface with a dopant of a second conductivity type opposite the first type; and forming an ohmic contact to at least part of the doped outer surface.

16. The process of claim 15 wherein the step of providing the semiconductor substrate comprises providing a substrate having therein a semiconductor region adjacent the surface and with a thickness less than the predetermined distance and adjacent the cavity and having a conductivity type opposite the first conductivity type.

17. The process of claim 15 further comprising prior to the step of at least partially filling the cavity, providing on the surface a material resistant to deposition of the substantially intrinsic semiconductor material and thereafter at least partially filling the cavity by selective deposition of the substantially intrinsic semiconductor material on the cavity bottom.

18. The process of claim 15 further comprising heavily doping the bottom of the cavity with a dopant of the first type.

19. The process of claim 15 further comprising coupling the ohmic contact to an input terminal of another device on the same substrate.

* * * * *